United States Patent [19]

Hartley et al.

[11] 4,352,698

[45] Oct. 5, 1982

[54] METHOD OF IMPROVING THE WEAR RESISTANCE OF METALS

[75] Inventors: Nicholas E. W. Hartley, Wantage; Alan Wilcockson, Newbury, both of England; David M. Sutherland, deceased, late of Wembley, England; by The Midland Bank Trust Company Limited, legal representative, London, England

[73] Assignee: United Kingdom Atomic Energy Authority, London, England

[21] Appl. No.: 212,340

[22] Filed: Dec. 2, 1980

[30] Foreign Application Priority Data

Dec. 3, 1979 [GB] United Kingdom ............... 7941579

[51] Int. Cl.³ .................................................. C21D 1/09
[52] U.S. Cl. .................................... 148/4; 148/6.35; 148/31.5; 148/39
[58] Field of Search ................ 148/4, 39, 6.35, 31.5; 204/192 N

[56] References Cited

U.S. PATENT DOCUMENTS

| | | | |
|---|---|---|---|
| 3,900,636 | 8/1975 | Curry et al. | 148/4 |
| 3,915,757 | 10/1975 | Engel | 204/192 N |
| 3,925,116 | 12/1975 | Engel | 148/4 |
| 3,988,955 | 11/1976 | Engel et al. | 204/192 N |
| 4,105,443 | 8/1978 | Dearnaley et al. | 148/4 |

OTHER PUBLICATIONS

Dearnaley et al., *Ion Implantation,* North-Holland Publishing Co., NY, NY, 1973, pp. 729–744.

*Primary Examiner*—Peter K. Skiff
*Attorney, Agent, or Firm*—William R. Hinds

[57] ABSTRACT

A process for improving the wear resistance of metals, comprising the operation of implanting into a metal article the wear resistance of which is to be improved ions of a material which is capable of forming within the article oxide compounds having a perovskite-type structure, and terminating the implantation of the ions when a dose of at least $10^{15}$ ions per square centimeter has been implanted.

The process may also include an oxidizing stage after the implantation of the ions. Examples of the process are described in which the article is made of a steel and the ions are selected from the group consisting of $Y^+$, $Sc^+$, $Yb^+$, $Ce^+$, $La^+$ and $Dy^+$.

10 Claims, No Drawings

METHOD OF IMPROVING THE WEAR RESISTANCE OF METALS

The present invention relates to the improvement of the wear resistance of metals, and especially the wear resistance of chromium-containing steels and nickel alloys.

It is known that the high-temperature oxidation behaviour of iron and nickel alloys can be improved by the implantation of ions of yttrium and other rare earth elements. The improvement is believed to arise from the formation of perovskite-type compounds incorporating the implanted ions and oxygen which is inevitably present in or on the surfaces of the alloys. These perovskite-type compounds form preferentially in the grain boundaries, which normally provide pathways for the diffusion both of oxygen inwards into the alloys and metal cations outwards, and block these pathways, thus reducing the long-term rate of oxidation after an initial phase in which the perovskite-type compounds are formed.

The present invention arises from the appreciation that as these perovskite-type compounds are very strongly bound to the alloys in which they are formed, and reduce the tendency of the oxides at high temperatures to spall from the surfaces of the alloys, they could well prevent the disruption of bearing surfaces of artefacts at the operating temperatures normally associated with mechanisms.

According to the present invention there is provided a process for improving the wear resistance of metals, comprising the operation of implanting into a metal article the wear resistance of which is to be improved ions of a material which is capable of forming within the article oxide compound having a perovskite- or spinel-type structure, and terminating the implantation of the ions when a dose of at least $10^{15}$ ions per square centimeter has been implanted.

If the metal article is made of a ferritic alloy such as stainless steel or tool steel, or a nickel based alloy such as that known by the code number N108, then a particularly advantageous ion is yttrium+. Other ions which are particularly useful are $Sc^+$, $Yb^+$, $Ce^+$, $La^+$ and $Dy^+$. The ions can be implanted alone, together, or with other ions species such as $CO^+$ or $N^+$. Also, the article can be subjected to an oxidising process after implantation to facilitate the formation of the oxide compounds.

Examples of the invention will now be described.

EXAMPLE 1

A region of each of a series of discs made of a medium carbon steel such as that known by the code designation En8 was implanted with one of the following ion species $Sc^+$, $Y^+$, $Yb^+$, $Ce^+$, $Nd^+$, $La^+$, $Dy^+$ or $Ho^+$. The implantation was carried out in a vacuum of $2 \times 10^{-7}$ torr using an ion beam current of a few micro amperes and a beam energy of 200 keV, and the implantation was continued until an ion dose of $5 \times 10^{-}$ions per sq. cm. had been implanted.

The discs were then tested in a standard pin and disc wear testing machine which it is not thought necessary to describe. The volumetric wear rates ($K_v$), as defined by the relation $K_v =$ volume of material removed/sliding distance $\times$ apparent area, of the implanted and unimplanted regions of the discs are listed in the table below:

| Disc | Ion | Dose per sq cm | $K_v \times 10^9$ (Unimplanted) | $K_v \times 10^9$ (Implanted) | Improvement I |
|---|---|---|---|---|---|
| A/1 | Sc | $5 \times 10^{15}$ | 28.6 | 3.0 | 9.4 |
| A/2 | Y | $5 \times 10^{15}$ | 24.9 | 2.5 | 9.9 |
| A/1 | Yb | $5 \times 10^{15}$ | 6.3 | 1.5 | 4.3 |
| B/2 | Ce | $5 \times 10^{15}$ | 13.6 | 1.8 | 7.7 |
| B/3 | Ho | $5 \times 10^{15}$ | 2.5 | 1.4 | 1.7 |
| B/4 | La | $5 \times 10^{15}$ | 1.8 | 0.6 | 2.9 |
| B/5 | Dy | $5 \times 10^{15}$ | 10.5 | 1.4 | 8.0 |
| B/5 | Nd | $5 \times 10^{15}$ | 4.8 | 1.7 | 2.8 |

It can be seen that all the ions have a beneficial effect.

A series of similar experiments using cerium and yttrium ions only show that the improvement in the wear rate is dose dependent with a large increase at a dose rate of about $10^-$ions per square cm. For cerium, the optimum dose is about $3.10^{\neq}$ions per square cm; for yttrium, the optimum dose rate is about $5.10^-$ions per square cm.

EXAMPLE 2

Each of four tool steel discs was then implanted under similar conditions to those of the previous example with one of the following ion species $Y^+$, $Ho^+$, $Dy^+$, $Yb^+$. The tool steel used had a high chromium content (12%). Each disc was implanted with two doses of the same ion, but different concentrations, one on each of the plane surfaces. The discs were then tested in the same way as before but at a higher load as the material is harder than the mild steel. The results are summarised in the table below:

| Disc | Face | Ion | Dose | $K_v \times 10^{10}$ (Unimplanted) | $K_v \times 10^{10}$ (Implanted) | (Improvement) I |
|---|---|---|---|---|---|---|
| E/1 | X | Y | $2 \times 10^{15}$ | 12 | 2.0 | 6.0 |
|  | O | Y | $5 \times 10^{15}$ | 14 | 1.9 | 7.4 |
| E/2 | X | Ho | $2 \times 10^{15}$ | 8.4 | 2.5 | 3.4 |
|  | O | Ho | $5 \times 10^{15}$ | 3.2 | 1.1 | 2.9 |
| E/3 | X | Dy | $2 \times 10^{15}$ | 6.7 | 3.2 | 2.1 |
|  | O | Dy | $5 \times 10^{15}$ | 5.7 | 3.0 | 1.9 |
| E/4 | X | Yb | $2 \times 10^{15}$ | 15.0 | 3.8 | 3.9 |
|  | O | Yb | $5 \times 10^{15}$ | 11.0 | 2.7 | 4.1 |

The improvements measured for the tool steel are comparable to those measured for the mild steel but as the load was four times greater than the load used when testing the mild steel, the improvement is, in fact, correspondingly greater.

EXAMPLE 3

A single disc made of En8 mild steel was implanted under the same conditions as before with equal doses of cerium and yttrium up to a total dose of $4 \times 10^{15}$ions per square cm. The disc was then tested in the same way as before. It was found that the wear rate decreased from $K_v = 4.1 \times 10^7$ to $K_v = 2.4 \times 10^8$ for two hours, and then remained constant at $K_v = 6.0 \times 10^8$ for many hours. These figures correspond to an initial improvement by a factor of 17.1 followed by a final improvement by a factor of 6.7.

EXAMPLE 4

A single disc of En8 mild steel was implanted under the same conditions as before with a dose of $3 \times 10^{16}$ ions per square cm. of aluminium. It was then wear tested both before and after being heated in an oxidising atmosphere at a temperature of 425° C. for a period of 20 minutes. The final wear rate was so low as to be undetectable by the apparatus used.

EXAMPLE 5

A previously tested disc (E/2 face and containing $2 \times 10^{15}$ Ho ions per sq. cm. was oxidised at 600° C. for 20 minutes and retested. Upon subsequent testing it was found that the oxidation of the unimplanted region of the disc effected an improvement over the original wear rate, and that the wear rate of the implanted region of the disc decreased even further. The results are summarised in the table below.

|  | Before oxidation $K_\nu \times 10^9$ | After oxidation $K_\nu \times 10^9$ |
|---|---|---|
| Untreated | 8.4 | 4.3 |
| Implanted | 2.5 | 0.42 |
| Improvement | 3.4 | 10.2 |

The improvement in the wear rate of the unimplanted region of the disc is due to the increase in hardness of the surface of the disc as a result of the oxidation process. Bearing in mind the general increase in hardness of the surface of the disc, the improvement factor is some four times better than that achieved by implantation only.

It is apparent that oxidation in addition to implantation is very beneficial.

EXAMPLE 6

A ball valve seat for use in an internal combustion engine fuel injection pump was implanted with a dose of $3 \times 10^{16}$ Y+ ions/cm² at an energy of 200 keV. The complete valve was assembled into a pump and run for a period of 1000 hrs. The rate of wear of the ball valve seat compared with that of an identical but unimplanted ball valve seat was reduced by two orders of magnitude. The experiment was repeated with two other ball valves, with similar results. A practical result is that it is possible to make the ball valve seats out of a lower grade of steel than hitherto. For example they can be made out of the tool steel known as Balfour '00' instead of a high speed tool steel.

We claim:

1. A process for improving the wear resistance of a surface portion of a metal article which is to be subject to contact with another article after assembly, comprising the operation of implanting into such a portion of a metal article, the wear resistance of which portion is to be improved, ions of a material which is capable of forming within the article oxide compounds having a perovskite or spinel type structure, and terminating the implantation of the ions when a dose of at least $10^{15}$ ions per square centimeter has been implanted and the wear resistance of said portion has been materially improved.

2. A process according to claim 1 wherein the ions are selected from group $III_B$ of the periodic table of elements, the rare earth elements or aluminium.

3. A process according to claim 2 wherein the ions are selected from the group comprising Y+, Sc+, Yb+, Ce+, La+, Ho+, Nd+, Dy+ and Al+.

4. A process according to claim 3 wherein the ions are Y+.

5. A process according to claim 1, claim 2, claim 3 or claim 4 wherein the selected ions are implanted together with Co+ or N+ ions.

6. A process according to claim 1 wherein the metal article is subjected to an oxidising operation subsequent to the implantation of ions of a material which is capable of forming an oxide with perovskite or spinel type structure thereby to facilitate the formation of the said oxide.

7. A process according to claim 1 wherein the metal article is made of a nickel-based alloy.

8. A process according to claim 1 wherein the metal article is made of a ferrous alloy.

9. A process according to claim 8 wherein the metal article is a ball valve seat for use in an internal combustion engine fuel injector, and a dose of $3 \times 10^{16}$ Y+ ions per square centimeter are implanted into the said ball valve seat.

10. A process according to claim 1 wherein said portion is a bearing surface on the article.

* * * * *